United States Patent [19]

Hill

[11] 4,088,901

[45] May 9, 1978

[54] CIRCUIT FOR RECOGNIZING A PULSE WAVEFORM AND AN IGNITION SYSTEM FOR AN I.C. ENGINE INCLUDING SUCH A CIRCUIT

[75] Inventor: William Frank Hill, Stafford, England

[73] Assignee: The Lucas Electrical Company Limited, Birmingham, England

[21] Appl. No.: 630,863

[22] Filed: Nov. 11, 1975

[30] Foreign Application Priority Data

Nov. 21, 1974 United Kingdom ............... 50452/74

[51] Int. Cl.[2] ............................................ H03K 5/01

[52] U.S. Cl. .................................... 307/236; 307/314; 328/113; 328/118; 328/223; 329/104; 315/209 T

[58] Field of Search ........................ 307/236, 282, 314; 328/113, 223, 118; 329/102, 103, 104; 315/209 T

[56] References Cited

U.S. PATENT DOCUMENTS

| | | | |
|---|---|---|---|
| 3,049,626 | 8/1962 | Shannon | 328/223 |
| 3,359,430 | 12/1967 | Jones | 307/282 X |
| 3,393,327 | 7/1968 | Savage | 328/113 X |
| 3,586,986 | 6/1971 | Martens et al. | 329/103 |
| 3,609,408 | 9/1971 | Motisher et al. | 328/113 X |
| 3,641,371 | 2/1972 | Cartwright | 307/236 X |
| 3,916,326 | 10/1975 | Woyton | 307/236 X |

*Primary Examiner*—John S. Heyman

*Attorney, Agent, or Firm*—Ladas, Parry, Von Gehr, Goldsmith & Deschamps

[57] ABSTRACT

A pulse waveform recognition circuit includes an input stage consisting of a tuned circuit tuned to approximately the frequency of a sinusoid to half-waves of which the pulses to be recognized approximate. A transistor is biased to conduct weakly and has its base coupled to the tuned circuit so as to be turned on by a pulse within the band width of the tuned circuit. The transistor drives a monostable multi-vibrator with a frequency dependent feedback circuit which causes the reversion time of the multi-vibrator to decrease as the frequency of triggering increases and which also increases the threshold voltage required to trigger the monostable circuit as this frequency increases. The circuit is used in an ignition system for an i.c. engine.

10 Claims, 4 Drawing Figures

Figure 4:
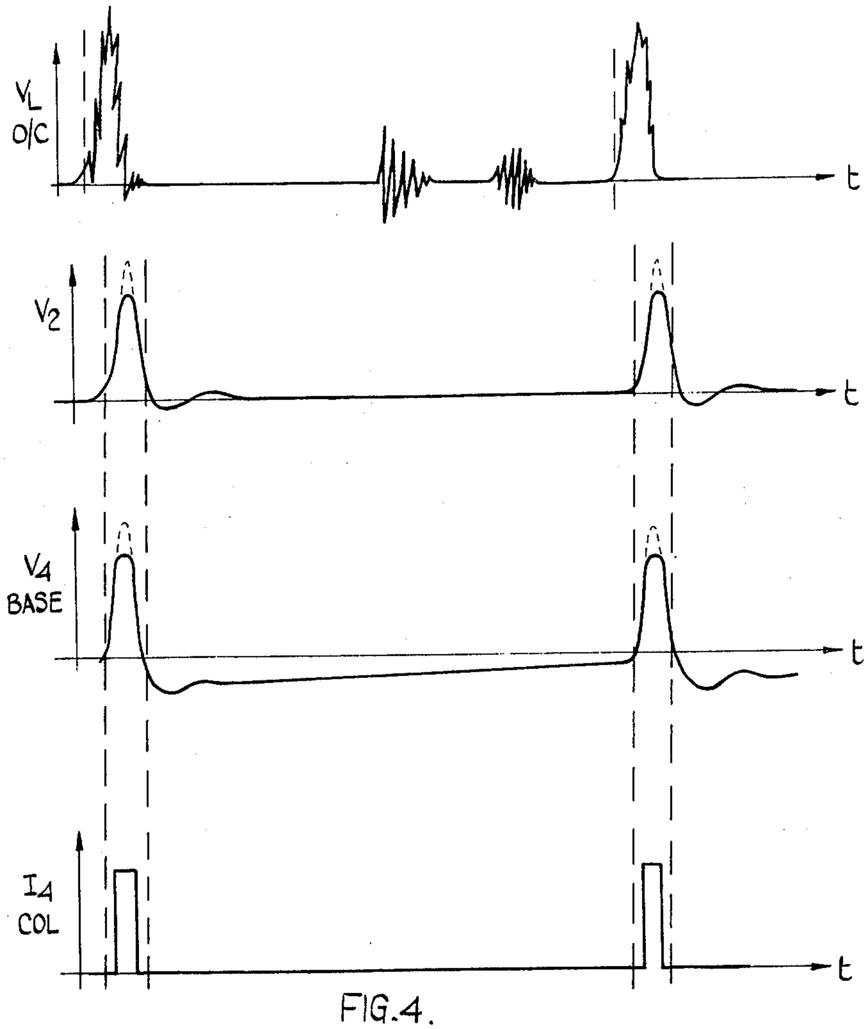

FIG.1.
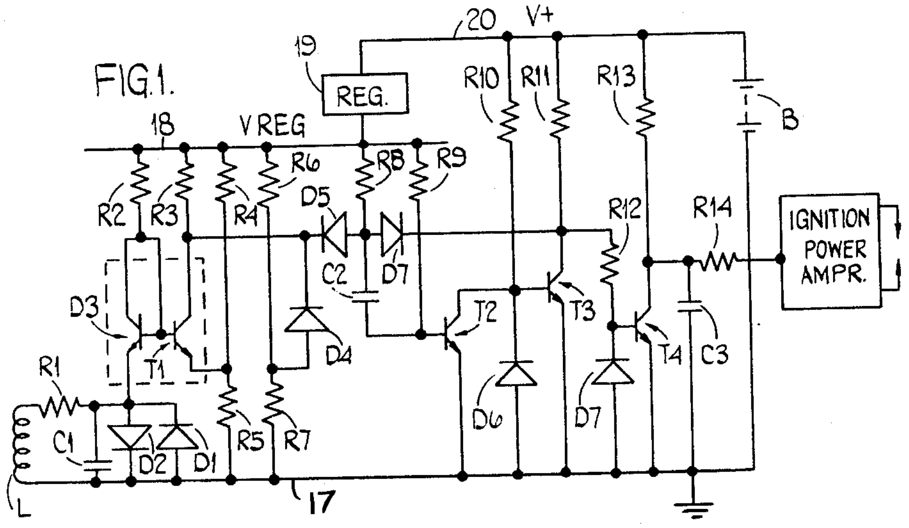
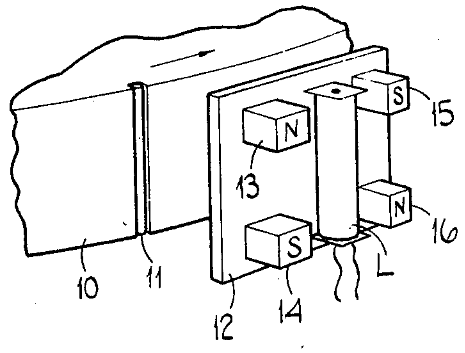
FIG.2.
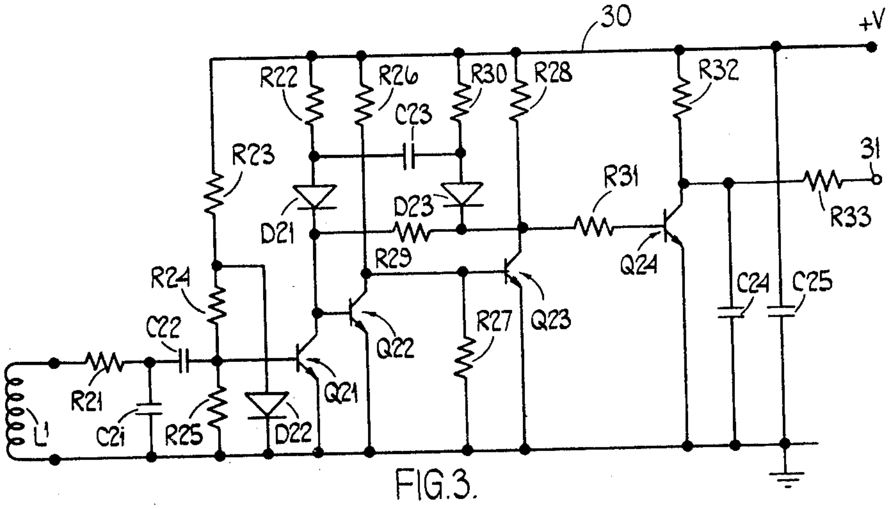
FIG.3.

CIRCUIT FOR RECOGNIZING A PULSE WAVEFORM AND AN IGNITION SYSTEM FOR AN I.C. ENGINE INCLUDING SUCH A CIRCUIT

This invention relates to a circuit for recognising a pulse waveform of unipolar shape approximating to a half wave sinusoid. It is one object of the invention to provide such a circuit which is capable of rejecting spurious signals.

A circuit in accordance with one aspect of the invention comprises an input stage consisting of a damped tuned circuit tuned to resonate at a frequency approximately equal to the frequency of the sinusoid to which the pulse waveform to be recognised approximate, semi-conductor amplifier means, coupling means coupling the tuned circuit to the amplifier means, and a bias circuit for the amplifier means biasing the amplifier means to a state in which it is almost non-conducting.

The invention also relates to ignition systems for i.c. engines utilizing a magnetic pick-up device driven by the engine to trigger ignition. It is another object of the invention to provide an ignition system in a convenient form.

In accordance with this aspect of the invention an i.c. engine ignition system includes a magnetic pick-up device driven by the engine and producing a train of pulses of unipolar shape approximating to a half wave sinusoid together with spurious signals, a pulse recognition circuit comprising an input stage which forms in combination with the pick-up a damped tuned circuit tuned to resonate at a frequency approximately equal to the frequency of said sinusoid, semi-conductor amplifier means, coupling means coupling said tuned circuit to the amplifier means and a bias circuit biasing the amplifier means to a state in which it is almost non-conducting, said amplifier means being rendered conductive by each pulse from the pick-up device, and an ignition control circuit connected to be triggered by the amplifier means to produce a spark whenever a pulse is produced by the pick-up device.

In the accompanying drawings

FIG. 1 is the circuit diagram of an example of an i.c. engine ignition system in accordance with the invention, FIG. 2 is a fragmentary perspective view of a pick-up which is used in the ignition system, FIG. 3 is the circuit diagram of a different form of pulse waveform recognition circuit which could be incorporated in place of that used in FIG. 1 and FIG. 4 is a graph showing waveforms at various points in the circuit of FIG. 3.

Referring firstly to FIGS. 1 and 2 the system shown includes a magnetic pick-up including a winding L which is arranged so that its axis is parallel to the rotary axis of a rotor 10 of a non-magnetic material. Set in the edge of the rotor 10 are a plurality (one for each engine cylinder) of magnetic bistable wire elements 11 which also have their axes parallel to the rotary axis of the rotor 10. The winding 11 is mounted on a carrier 12 on which there are carried two pairs of magnets 13, 14, 15, 16, the pair 13, 14 being arranged on one side of the winding L and the pair 15, 16 being arranged on the other. As the wire 11 approaches the carrier 10 it is magnetized in one direction by the magnets 13, 14 (if it is not already magnetized in that direction). The wire then passes close to the winding L and whilst it is close to the winding it comes into the magnet field of the magnets 15, 16 which reverse the magnetization of the wire. This reversal of the magnetisation of the wire occurs whilst the winding L is in the magnetic field of the wire, so that a voltage pulse of short duration and approximately half wave sinusoid form is induced in the winding L. The amplitude of this pulse is an order of magnitude greater than the amplitude of any voltage induced by variable reluctance effects, but various other electrical interference may be present which will superimpose other waveforms on the output of the winding and the output of the winding L may typically be as shown in the upper-most trace in FIG. 4. The width of each pulse is relatively independent on the speed of rotation of the rotor 10, typically varying by only ±25% over the normal engine speed range.

It will be appreciated that the rotor 10 may take the place of the cam in a conventional contact breaker/distributor assembly, the carrier 12 being mounted on the conventional contact carrier, so that normal vacuum/-speed advance and retard action is obtained.

The circuit shown in FIG. 1 is intended to recognize the half wave sinusoid pulse produced by the pick-up winding L but to ignore electrical noise and other interference.

To this end the circuit includes as an input stage a resistor $R_1$ and a Capacitor $C_1$ forming in combination with the winding L a sub-critically damped tuned circuit which resonates at a frequency the half-period of which is approximately equal to the mean pulse length emitted by the winding L. One side of the capacitor $C_1$ is connected to an earth rail 17 and the capacitor is bridged by two parallel reverse connected diodes $D_1$ and $D_2$ one of which serves to limit the voltage which can exist across the capacitor $C_1$ and the other of which is provided for protection against reverse polarity connection of the circuit to the battery B, The other side of the capacitor is coupled via a diode connected n-p-n transistor $D_3$ to the base of an n-p-n transistor $T_1$. The base and collector of the transistor $D_3$ are connected together and by a resistor $R_2$, to a rail 18 which is in turn connected to a regulated supply 19 powered via a rail 20 from the battery B. The voltage on the rail 18 is a multiple of the base-emitter voltage of a transistor included in the regulated supply 19 so that it fluctuates with temperature in the same manner as other semi-conductor component parameters in the circuit.

The bases of the two transistors $D_3$ and $T_1$ are connected together and the emitter of the transistor $D_3$ is connected to said other side of the capacitor $C_1$. The collector of the transistor $T_1$ is connected to the rail 18 via a resistor $R_3$ and the emitter of the transistor $T_1$ is connected to the common point of a low-impedance resistance chain $R_4$, $R_5$. The ratio of $R_4$ and $R_5$ is chosen so that, in the absence of a pulse from the winding L, the voltage at their common point is less than the forward breakdown voltage of the diode $D_2$ and the resistor $R_2$ is chosen so that the transistor $T_1$ conducts only very weakly. The transistor $D_1$ also conducts weakly via the resistor $R_1$ and the winding L. The transistors $D_3$ and $T_1$ operate as a transconductance amplifier.

When the winding L produces a pulse the voltage waveform appearing at the emitter of transistor $D_3$ is a smoothed version of the voltage waveform of the output of the winding except that at the end of the pulse the voltage on the capacitor $C_1$ will reverse because the tuned circuit of which it forms part is sub-critically damped. Whilst the forward voltage exists the transistor $T_1$ is biased to conduct more strongly so that the voltage at the emitter of transistor $T_1$ tends to follow the voltage at the emitter of the transistor $D_3$. When the voltage on the capacitor $C_1$ reverses the transistor $T_1$ turns off completely.

The collector of the transistor $T_1$ is also connected to the cathode of a diode $D_4$, the anode of which is connected to the common point of a higher impedance resistance chain $R_6$, $R_7$. The collector of the transistor $T_1$ is furthermore connected to the cathode of a diode $D_5$ with its anode connected by a yet higher impedance resistor $R_8$ to the rail 18. A capacitor $C_2$ has one side connected to the anode of the diode $D_5$ and the other side connected via a resistor $R_9$ to the rail 18.

Said other side of the capacitor C2 is also connected to the base of an n-p-n transistor $T_2$ the emitter of which is connected to the rail 17 and the collector of which is connected via a resistor $R_{10}$ to the rail 20. The collector of the transistor $T_2$ is connected to the base of an n-p-n transistor $T_3$ and also to the cathode of a protective diode $D_6$, the emitter of the transistor $T_3$ being connected to the rail 17 and its collector being connected to the rail 18 by a resistor $R_{11}$. The collector of the transistor $T_3$ is connected to the cathode of a diode $D_7$ which has its anode connected to the anode of the diode $D_5$.

The transistors $T_2$ and $T_3$ and their associated components act as a monostable multi-vibrator in the stable state of which the transistor $T_2$ conducts and the transistor $T_3$ in non-conductive. When a negative-going trigger pulse is applied via the diode $D_5$ the transistor $T_2$ turns off, turning on the transistor $T_3$ thereby providing positive feedback via the capacitor $C_2$ until this is fully charged when the circuit reverts to its stable state. At low frequency the reversion time is constant but at higher frequency the reversion time decreases and the mark-to-space ratio tends towards the ratio $R_9$:$R_8$ as the frequency increases.

In order to turn off the transistor $T_2$ the transistor $T_1$ must draw sufficient current to take substantially all the current from the resistor $R_9$ (this is speed invariant), current from resistors $R_3$ and $R_8$ (this is speed dependent since the current will depend on the state of charge of the capacitor $C_2$) and the current from the diode $D_4$ (this too is speed dependent). The net result is that the voltage at the emitter of the transistor $D_1$ required to trigger the monostable increases with frequency — i.e., with engine speed. This lessens the risk of the circuit being spuriously triggered as a result of increasing voltage output from the coil L resulting from the variable reluctance effect mentioned above as distinct from the increasing pulse amplitude at higher speeds.

The collector of the transistor $T_3$ is connected via a resistor $R_{12}$ to the base of an n-p-n output transistor $T_4$ which has its emitter connected to the rail 17 and its collector connected via a resistor $R_{13}$ to the rail 20. A protective diode is connected between the base and emitter of the transistor $T_4$ which acts as an inverting buffer. A capacitor $C_3$ is connected between the collector of the transistor $T_4$ and the rail 17 and the output of the circuit is taken from the collector of transistor $T_4$ via a resistor $R_{14}$.

Thus, when each pulse is produced by the pick-up, there is a positive-going pulse produced by the transistor $T_4$ of duration corresponding to the reversion time of the monostable circuit mentioned above. This pulse is fed to an ignition power amplifier circuit 21 which may include a step-up transformer arranged so that a spark occurs at the spark plug 22 when the negative-going output pulse appears.

Turning now to FIG. 3 the circuit includes an input stage consisting of a subcritically damped tuned circuit made up of an inductor $L^1$ which is part of a pick-up similar to that shown in FIG. 1, a resistor $R_{21}$ and a capacitor $C_{21}$ in a series circuit. The value of the capacitor $C_{21}$ is so chosen in relation to the inductor $L^1$ that the circuit is tuned to resonate at a frequency approximately equal to the frequency of the sinusoid to which the half waves to be recognized approximate. The resistor $R_{21}$ is so chosen that the damping of the circuit is just subcritical. The waveform which is produced by the transducer (i.e., across the inductor $L^1$) is shown in the upper trace of FIG. 4. As shown the waveform includes pulses of approximately half wave sinusoidal form upon which a great deal of higher frequency noise is superimposed.

The second trace of FIG. 4 shows the voltage which actually appears across the capacitor $C_{21}$. The broken line indicates how the voltage across the capacitor $C_{21}$ is unloaded by the transistor $Q_{21}$ and the solid line the actual waveform in the circuit shown in FIG. 3. It will be observed that the high frequency noise has been substantially suppressed. This results from the fact that the impedance of the capacitor $C_{21}$ is very low compared with that of the inductor $L^1$ and the resistor $R_{21}$ to inductively introduced noise. Similarly any spurious high frequency signals introduced capacitively into the circuit via the lead connecting the inductor $L^1$ to the resistor $R_{21}$ are also suppressed since the impedance of $C_{21}$ will be much lower than the impedance of the stray capacitance coupling these signals into the lead.

The input stage described is a.c. coupled by a capacitor $C_{22}$ to the base of n-p-n transistor $Q_{21}$ which has its emitter grounded and the collector of which is connected to the cathode of a diode $D_{21}$ the anode of which is connected by a resistor $R_{22}$ to a positive supply rail 30. The transistor $Q_{22}$ has a bias circuit constituted by a pair of resistors $R_{23}$, $R_{24}$ in series between the rail 30 and the base of the transistor $Q_{21}$, a diode $D_{22}$ with its anode connected to the interconnection of the resistors $R_{23}$, $R_{24}$ and its cathode grounded, and a resistor $R_{25}$ connecting the base of the transistor $Q_{21}$ to earth. These components are so selected that the transistor $Q_{21}$ is just conductive, the diode $D_{22}$ tending to hold the base voltage too low for substantial conduction.

The third trace of FIG. 4 shows the voltage applied to the base of the transistor $Q_{21}$ which draws current from the tuned circuit and therefore accounts for the drop in peak voltage. The final trace shows the current flow through the collector of the transistor $Q_{21}$. The sharp rectangular waveform obtained is obtained without any feedback and results from the high gain of the transistor configuration.

It will be noted that, because the tuned circuit is subcritically damped, the voltage across $C_{21}$ as shown in FIG. 4 (second trace) becomes negative briefly immediately after the receipt of the input pulse. This negative voltage is rectified by the base-emitter diode of the transistor $Q_{21}$ and the negative voltage is stored on the capacitor $C_{22}$ which discharges slowly through the resistor $R_{25}$ and through the resistor $R_{24}$. This effect is indicated by the third trace of FIG. 4 which shows the base voltage on the transistor $Q_{21}$. As a result the transistor $Q_{21}$ is reversed biased for the time between receiving pulses and this assists in preventing triggering of the circuit by spurious signals.

The remainder of the circuit acts as a monostable circuit for pulse prolongation and a buffer. An n-p-n transistor $Q_{22}$ has its base directly coupled to the collector of the transistor $Q_{21}$, its emitter being grounded and its collector being connected to the rail 30 via a resistor $R_{26}$ and to ground via a resistor $R_{27}$. The collector of the transistor $Q_{22}$ is also connected to the base of an n-p-n transistor $Q_{23}$ which has its emitter grounded and its collector connected to the rail 30 by a resistor $R_{28}$. The collectors of the transistors $Q_{21}$ and $Q_{23}$ are interconnected by a resistor $R_{29}$ and the collector of the transistor $Q_{23}$ is connected to the cathode of a diode $D_{23}$ which has its anode connected to the rail 30 by a resistor $R_{30}$. A capacitor $C_{23}$ interconnects the anode of the diodes $D_{21}$ and $D_{23}$.

The buffer stage is constituted by an n-p-n transistor $Q_{24}$ with its base coupled by a resistor $R_{31}$ to the collector of the transistor $Q_{23}$. The emitter of the transistor $Q_{24}$ is grounded and its collector is connected to the rail 30 by a resistor $R_{32}$. The collector of the transistor $Q_{24}$ is also connected to ground by a capacitor $C_{24}$ and connected to the output terminal 31 by a resistor $R_{33}$. A capacitor $C_{25}$ is connected between the supply rail 30 and ground.

Although the circuit described can be used in an ignition system it can also be used for many other applications, particularly where it is required to determine the position of a rotating or linearly movable member accurately.

I claim:

1. In combination, a magnetic transducer comprising an inductor and magnetic means for inducing in the inductor periodically a pulse waveform of unipolar shape approximating to a half wave sinusoid, and a recognition circuit including a capacitor and resistor in series with the inductor and forming a damped tuned circuit tuned to resonate at a frequency approximately equal to the frequency of the sinusoid to which the pulse waveform to be recognized approximates, semiconductor amplifier means having an input across which the capacitor is connected, coupling means coupling the tuned circuit to the amplifier means and a bias circuit for the amplifier means biasing the amplifier means to a state in which it is almost non-conducting.

2. A circuit as claimed in claim 1 in which the coupling means is a coupling capacitor and the biasing means includes a diode connected to that when the voltage of the capacitor of the turned circuit reverses following a pulse applied thereto the amplifier means is reversed biased for a period.

3. A circuit as claimed in either claim 1 in which the amplifier means is a transistor forming part of a transconductance amplifier.

4. A circuit as claimed in claim 3 including a monostable circuit connected to be driven out of its stable state when said transistor becomes conductive.

5. A circuit as claimed in claim 1 in which said damped tuned circuit is a subcritically damped tuned circuit.

6. A circuit as claimed in claim 1 in which said magnetic means includes a length of bistable magnetic wire and magnetic polarizing means acting on said wire to reverse the magnetization thereof whilst the wire is magnetically coupled to the inductor.

7. A circuit for recognizing a pulse waveform of unipolar shape approximating to a half wave sinusoid, said circuit comprising an input stage consisting of a damped tuned circuit tuned to resonate at a frequency approximately equal to the frequency of the sinusoid to which the pulse waveform to be recognized approximates, semi-conductor amplifier means, coupling means coupling the tuned circuit to the amplifier means and a bias circuit for the amplifier means biasing the amplifier means to a state in which it is almost non-conducting, and in which the amplifier means is a transistor forming part of a transconductance amplifier and the transistor has its base connected to the base and collector of a diode connected transistor, the bases being connected via a resistor to one of a pair of supply rails, the emitter of the diode connected transistor being connected to the other supply rail via a d.c. path through said tuned circuit, and the emitter of said transistor being connected to the common point of a low impedance resistance chain connected between said rails.

8. A circuit as claimed in claim 7 including a monostable circuit connected to be driven out of its stable state when said transistor becomes conductive.

9. A circuit as claimed in claim 8 wherein the monostable circuit includes a frequency dependent feedback circuit whereby the reversion time of the monostable circuit reduces as the frequency of triggering thereof increases.

10. A circuit as claimed in claim 9 in which said frequency dependent feedback circuit is connected to vary the bias on said transistor so that the output voltage from the tuned circuit required to trigger the monostable circuit increases as the frequency of operation increases.

* * * * *